(12) United States Patent
Terashima

(10) Patent No.: US 6,864,550 B2
(45) Date of Patent: Mar. 8, 2005

(54) SEMICONDUCTOR DEVICE

(75) Inventor: Tomohide Terashima, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/647,288

(22) Filed: Aug. 26, 2003

(65) Prior Publication Data
US 2004/0178471 A1 Sep. 16, 2004

(30) Foreign Application Priority Data

Mar. 10, 2003  (JP) .................................... 2003-062927

(51) Int. Cl.[7] .................. H01L 29/76; H01L 29/94; H01L 31/062; H01L 31/113; H01L 31/119
(52) U.S. Cl. .................. 257/393; 257/368; 257/392
(58) Field of Search ............................. 257/368, 392, 257/393

(56) References Cited

U.S. PATENT DOCUMENTS

2002/0000867 A1 * 1/2002 Daniel et al. .............. 327/525

FOREIGN PATENT DOCUMENTS

JP        10-004143      1/1988

OTHER PUBLICATIONS

"1200V High–Side Lateral MOSFET in Junction–Isolated Power IC Technology Using Two Field–Reduction Layers", J.S. Ajit et al., Proceedings of The 5th International Symposium on Power Semiconductor Devices and IC's May 18–20, 1993, pp 230–235.

"Self–Shielding: New High–Voltage Inter–Connection Technique for HVICs", Tatsuhiko Fujihara et al., 1996 IEEE, pp. 231–234.

* cited by examiner

Primary Examiner—Long Pham
(74) Attorney, Agent, or Firm—McDermott Will & Emery LLP

(57) ABSTRACT

A source electrode $V_{dd}$ is formed in a region between a field PMOS 1 and a field PMOS 2 as high side switches of a latch circuit. This latch circuit is utilized in the state where a lower side of one of the two high side switches is completely depleted. Field PMOS 1 and field PMOS 2 share a $P^+$-type impurity diffusion region, an $N^+$-type impurity diffusion region and a $P^+$-type impurity diffusion region, which are connected to source electrode $V_{dd}$. It is therefore possible to provide a semiconductor device capable of reducing the area thereof in the direction parallel to the main surface of a semiconductor substrate.

6 Claims, 15 Drawing Sheets

SEMICONDUCTOR DEVICE

BACKGROUND OF THE INVENTION

1. Field of the Invention

The present invention relates to a semiconductor device with field-effect transistors.

2. Description of the Background Art

Conventionally, semiconductor devices using field-effect transistors have been manufactured. One field-effect transistor is provided in an element formation region surrounded by an element isolation part when viewed in the direction perpendicular to the main surface of a semiconductor substrate in such semiconductor devices. A single P-channel type transistor, for example, is provided in the element formation region and no other elements are provided in this structure.

It is necessary to individually separate transistors by means of an element isolation part in a semiconductor device having a structure that only a single field-effect transistor is formed in an element formation region as described above. Therefore, the area of the semiconductor device cannot be reduced in the direction parallel to the main surface of the semiconductor substrate.

SUMMARY OF THE INVENTION

It is an object of the present invention to provide a semiconductor device having a structure capable of achieving miniaturization of elements in a surface parallel to the main surface of a semiconductor substrate.

A semiconductor device according to the present invention includes: an element isolation part surrounding one element formation region when viewed in the direction perpendicular to a main surface of a semiconductor substrate and electrically isolating the one element formation region from another element formation regions; and a plurality of elements provided in the element formation region. The plurality of elements includes a first field-effect transistor and a second field-effect transistor functioning as high side switches of a latch circuit. The semiconductor device is utilized in the state where a lower side of one of the first field-effect transistor and the second field-effect transistor is completely depleted. The first field-effect transistor and the second field-effect transistor share a source region or a drain region.

With this configuration, it becomes possible to reduce the area of the element formation region where the high side switch of the latch circuit is formed. Accordingly, it becomes possible to miniaturize the semiconductor device.

A semiconductor device according to a second aspect of the present invention includes: a first field-effect transistor having a channel region of a first conductive type; and a second field-effect transistor having a channel region of a second conductive type which is a conductive type opposite to the first conductive type.

Further, in the semiconductor device, the gate electrode of the first field-effect transistor and the drain electrode of the second field-effect transistor are integrally formed of the same conductive layer and extend in sequence in a predetermined direction in a linear manner. Further, in the semiconductor device, the source electrode of the first field-effect transistor and the source electrode of the second field-effect transistor are integrally formed of the same conductive layer and extend in sequence in a predetermined direction in a linear manner.

Further, the difference in potential between the source electrode of the first field-effect transistor and the drain electrode of the second field-effect transistor is approximately the same as the difference in potential between the gate electrode and the source electrode of the first field-effect transistor.

Further, the punch through voltage between the impurity diffusion region of the second conductive type beneath the drain electrode of the second field-effect transistor and the impurity diffusion region of the second conductive type beneath the gate electrode of the first field-effect transistor is greater than the difference in potential between the source electrode of the first field-effect transistor and the drain electrode of the second field-effect transistor.

With this configuration, the distance between the first field-effect transistor and the second field-effect transistor can be extremely small. Therefore, the area of the element formation region can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, semiconductor devices according to embodiments of the present invention will be described with reference to the drawings.

First Embodiment

Figure 1:
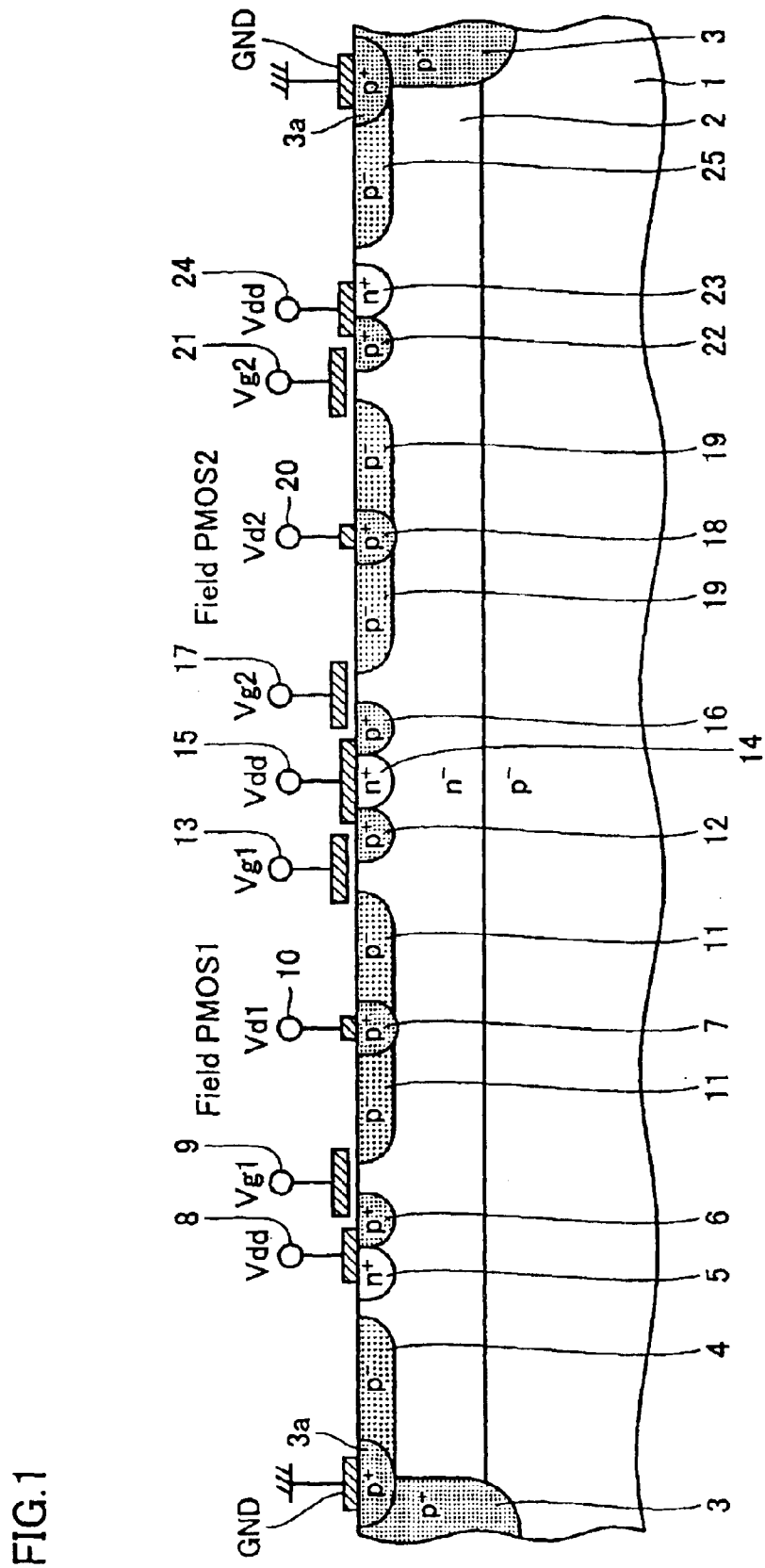
FIG. 1 is a diagram for describing a structure of a semiconductor device according to a first embodiment.

First, a structure of a semiconductor device according to a first embodiment will be described with reference to FIGS. 1 to 4. As shown in FIG. 1, the semiconductor device according to the present embodiment includes a P⁻-type semiconductor substrate 1, and an N⁻-type epitaxial layer 2 formed in the range from the main surface of P⁻-type semiconductor substrate 1 to a predetermined depth. Further, the semiconductor device according to the present embodiment includes a P⁺-type impurity diffusion region 3 formed in the range from the main surface of P⁻-type semiconductor substrate 1 to a predetermined depth and a P⁺-type impurity diffusion region 3a formed on the upper portion of P⁺-type impurity diffusion region 3 inside N⁻ epitaxial layer 2.

Further, a P⁻-type impurity diffusion region 4 is formed adjacent to the side of P⁺-type impurity diffusion region 3a. Further, an N⁺-type impurity diffusion region 5 is formed at a predetermined distance away from the side of P⁻-type impurity diffusion region 4. A P⁺-type impurity diffusion region 6 is formed adjacent to N⁺-type impurity diffusion region 5. A source electrode $V_{dd}$ electrode 8 is provided so as to be connected to N⁺-type impurity diffusion region 5 and P⁺-type impurity diffusion region 6, respectively.

Further, a P⁻-type impurity diffusion region 11 is formed at a distance away from the side of P⁺-type impurity diffusion region 6. Further, a gate electrode $V_{g1}$ 9, having a region between P⁺-type impurity diffusion region 6 and P⁻-type impurity diffusion region 11 as a channel region, is formed above semiconductor substrate 1. Further, a P⁺-type impurity diffusion region 7 is formed on a region inside P⁻-type impurity diffusion region 11. A drain electrode $V_{d1}$ 10 is connected to the upper surface of P⁺-type impurity diffusion region 7.

Further, a P⁺-type impurity diffusion region 12 is formed at a predetermined distance away from the side of P⁻-type impurity diffusion region 11. A gate electrode $V_{g1}$ 13 is formed so as to have a region between P⁺-type impurity diffusion region 12 and P⁻-type impurity diffusion region 11 as a channel region. An N⁺-type impurity diffusion region 14 is formed adjacent to P⁺-type impurity diffusion region 12. Further, a P⁺-type impurity diffusion region 16 is formed adjacent to N⁺-type impurity diffusion region 14. Further, a source electrode $V_{dd}$ 15 is formed so as to bring into contact with P⁺-type impurity diffusion region 12, N⁺-type impurity diffusion region 14 and P⁺-type impurity diffusion region 16, respectively.

Further, a P⁻-type impurity diffusion region 19 is formed at a predetermined distance away from P⁺-type impurity diffusion region 16. A gate electrode $V_{g2}$ 17 is formed so as to have a region between P⁻-type impurity diffusion region 19 and P⁺-type impurity diffusion region 16 as a channel region. Further, a P⁺-type impurity diffusion region 18 is formed on a region inside P⁻-type impurity diffusion region 19. Further, a drain electrode $V_{d2}$ 20 is connected to P⁺-type impurity diffusion region 18. A P⁺-type impurity diffusion region 22 is formed at a predetermined distance away from P⁻-type impurity diffusion region 19. A gate electrode $V_{g2}$ 21 is formed so as to have a region between P⁺-type impurity diffusion region 22 and P⁻-type impurity diffusion region 19 as a channel region.

Further, an N⁺-type impurity diffusion region 23 is provided adjacent to P⁺-type impurity diffusion region 22. A source electrode $V_{dd}$ 24 is connected to P⁺-type impurity diffusion region 22 and N⁺-type impurity diffusion region 23, respectively. Further, a P⁻-type impurity diffusion region 25 is formed at a predetermined distance away from the side of N⁺-type impurity diffusion region 23. Further, P⁻-type impurity diffusion region 25 is located adjacent to P⁺-type impurity diffusion region 3a. Further, P⁺-type impurity diffusion region 3a is provided with P⁺-type impurity diffusion region 3 in its lower side. It is noted that P⁺-type impurity diffusion region 3a is connected to a ground electrode.

The left side of the above described semiconductor device, with N⁺-type impurity diffusion region 14 serving as the border, forms a field PMOS (P Channel Metal Oxide Semiconductor) 1 and the right side thereof forms a field PMOS 2. It is noted that a field PMOS (NMOS) means a MOS transistor having a gate insulating film formed of a LOCOS (LOCal Oxidation of Silicon) field oxide film. It is noted that gate insulating films formed between gate electrodes and the semiconductor substrate are not shown in the drawings of the present specification.

Field PMOS 1 and field PMOS 2, as high side switches of a latch circuit, share P⁺-type impurity diffusion region 12, N⁺-type impurity diffusion region 14 and P⁺-type impurity diffusion region 16, which are connected to source electrode $V_{dd}$ 15, in the above described semiconductor device. Therefore, the area of the element formation region in the direction parallel to the main surface of semiconductor substrate 1 is reduced in comparison with the prior art. As a result, the semiconductor device can be miniaturized. It is noted that a high side switch means a switch connected to a power supply electrode (high potential side) in the case where two switch elements are connected in series between the power supply electrode (high potential side) and a ground electrode (low potential side).

Figure 2:
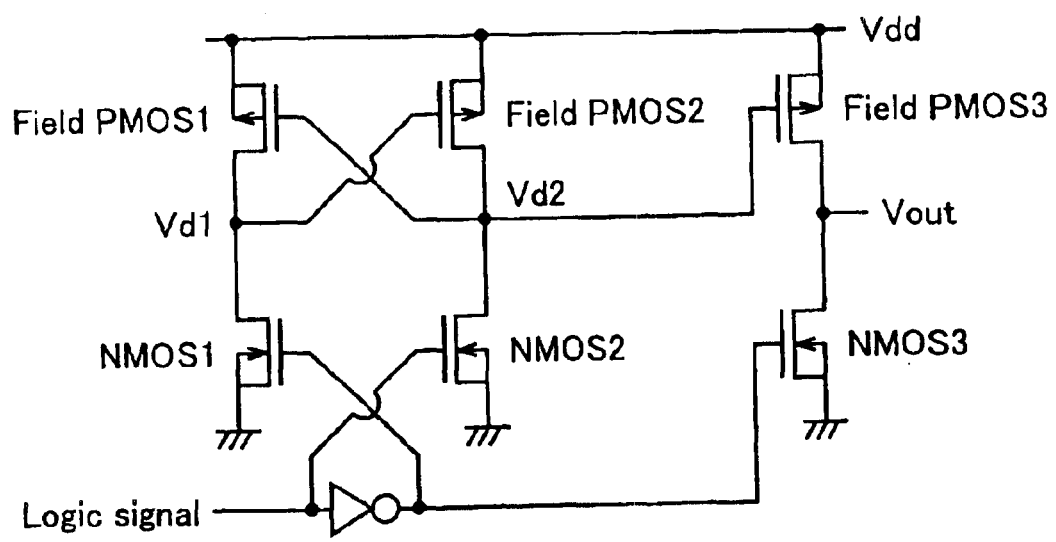
FIG. 2 is a circuit diagram of the semiconductor device according to the first embodiment.

It is noted that FIG. 2 is a diagram showing a way of use in the semiconductor device shown in FIG. 1 as a circuit (latch circuit). In addition, the high side of the latch circuit is the side connected to the electrode to which voltage $V_{dd}$ of the latch circuit shown in FIG. 2 is applied, and field PMOS 1, field PMOS 2 and field PMOS 3 correspond to the high side switches in the latch circuit of the present embodiment.

Figure 3:
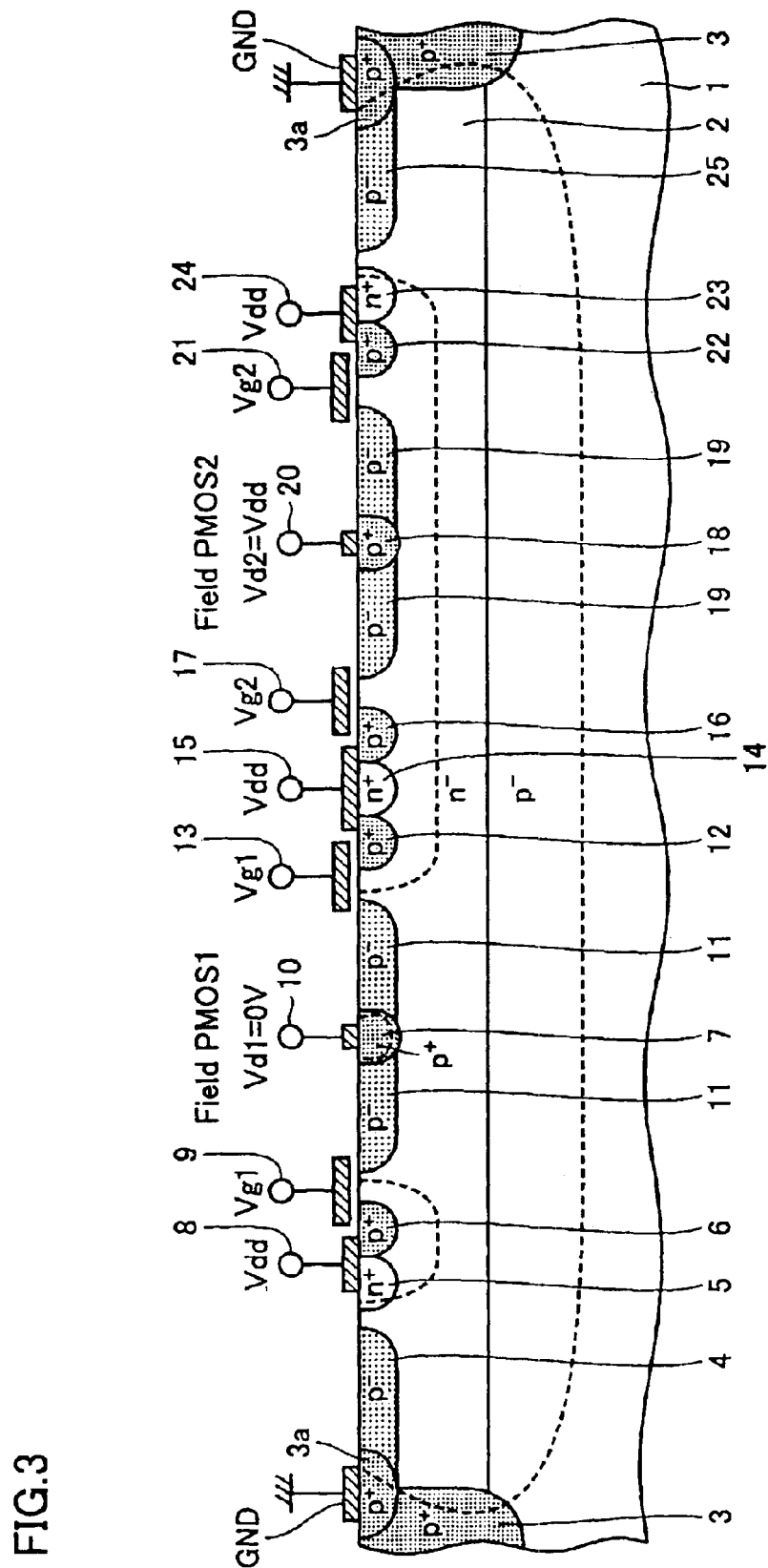
FIG. 3 is a diagram for describing a depletion layer formed when the semiconductor device according to the first embodiment operates.

The dotted line in FIG. 3 shows a depletion layer formed in the case where a voltage equal to or more than threshold voltage is applied to gate electrode $V_{g2}$ 17, 21 so that the voltage of drain electrode $V_{d2}$ 20 becomes $V_{dd}$ and, also, a voltage equal to or less than threshold voltage is applied to gate electrode $V_{g1}$ 9, 13 so that the voltage of drain electrode $V_{d1}$ 10 becomes 0. Further, the dotted line in FIG. 4 shows a depletion layer formed in the case where a voltage equal to or more than threshold voltage is applied to gate electrode $V_{g1}$ 9, 13 so that the voltage of drain electrode $V_{d1}$ 10 becomes $V_{dd}$ and, also, a voltage equal to or less than threshold voltage is applied to gate electrode $V_{g2}$ 17, 21 so that the voltage of drain electrode $V_{d2}$ 20 becomes 0.

Figure 4:
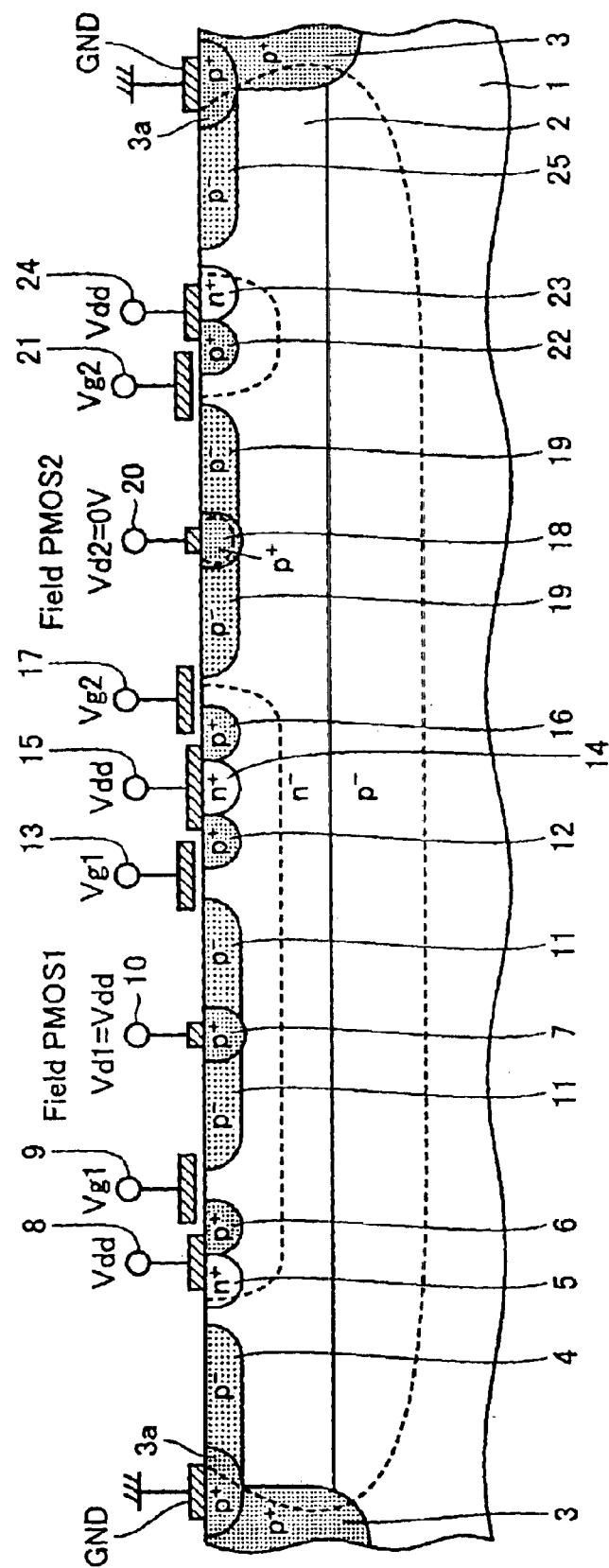
FIG. 4 is a diagram for describing a depletion layer formed when the semiconductor device according to the first embodiment operates.

As can be seen from FIGS. 3 and 4, the depletion layer extends from P⁻-type semiconductor substrate 1 and impurity diffusion regions type P⁻ 4, P⁺ 6, P⁻ 11, P⁺ 12, P⁺ 16, P⁻ 19, P⁻ 22 and P⁻ 25, respectively, when the latch circuit is in the off-state; thereby, N⁻-type epitaxial layer 2 is completely depleted. Accordingly, the surface electrical field of N-type epitaxial layer 2 is relaxed.

Further, the depletion layer extending from P⁻-type semiconductor substrate 1 does not reach impurity diffusion regions type P⁻ 4, P⁻ 6, P⁻ 11, P⁺ 12, P⁺ 16, P⁻ 19, P⁺ 22 and P⁻ 25. Such an effect is an effect accompanying the structure of relaxing the surface electrical field referred to as DOUBLE RESURF, and is described in Japanese Patent Laying-Open No. 10-4143. The withstand voltage of the element becomes a one-dimensional withstand voltage in the direction perpendicular to the main surface of the semiconductor substrate if the DOUBLE RESURF condition for relaxing the surface electrical field is satisfied. Accordingly, the withstand voltage of the element is determined by the withstand voltage between P-type semiconductor substrate 1 and N⁻-type epitaxial layer 2.

It is therefore possible to easily change the withstand voltage by adjusting the respective concentrations of the impurities in P⁻-type semiconductor substrate 1 and N⁻-type epitaxial layer 2. It is therefore possible to make the withstand voltage equal to or more than 1000 V. As a result, a logic signal can be converted into a digital signal of approximately 1000 V according to the latch circuit of the present embodiment. Therefore, the latch circuits of the present embodiment, as well as of the respective embodiments described below, are considerably useful as drive circuits in regard to electrostatic induction force or piezoelectric force that become drive sources of MEMS (Micro Electro Mechanical Systems).

Second Embodiment

Next, a structure of a semiconductor device according to a second embodiment will be described with reference to FIG. 5. The structure of the semiconductor device according to the second embodiment is approximately similar to that of the semiconductor device, shown in FIG. 1, of the first embodiment. However, the structure of the semiconductor device according to the present embodiment differs from that of the semiconductor device shown in FIG. 1 of the first embodiment only in that an N⁺-type impurity diffusion region 28 is formed inside P⁺-type impurity diffusion region 18.

Accordingly, a field P-channel IGBT (Insulated Gate Bipolar Transistor), instead of field PMOS 2, is formed in the right side of the semiconductor device of the present embodiment with source electrode $V_{dd}$ 15 as the border. A forward bias (positive bias) generates between P⁺-type impurity diffusion region 18 and N⁺-type impurity diffusion region 28 in this P-channel IGBT; thereby, an NPN transistor having N⁺-type impurity diffusion region 28 as an emitter electrode functions. Thereby, the current is amplified to be multiplied by hFE by means of the NPN transistor.

Field PMOS 1 and the field P-channel IGBT, as high side switches of a latch circuit, also share P⁺-type impurity diffusion region 12, N⁺-type impurity diffusion region 14 and P⁺-type impurity diffusion region 16, which are connected to source electrode $V_{dd}$ 15, in the above described semiconductor device of the present embodiment. Therefore, the area of the element formation region in a plane parallel to the main surface of semiconductor substrate 1 can be reduced. As a result, it is possible to miniaturize the semiconductor device.

Further, the on-resistance of the P-channel IGBT is sufficiently small; therefore, it is not necessary to provide PMOS 3 for output, as shown in FIG. 2. Accordingly, the area of the element formation region in the direction parallel to the main surface of semiconductor substrate 1 can be further reduced in comparison with the semiconductor device according to the first embodiment.

Figure 5:
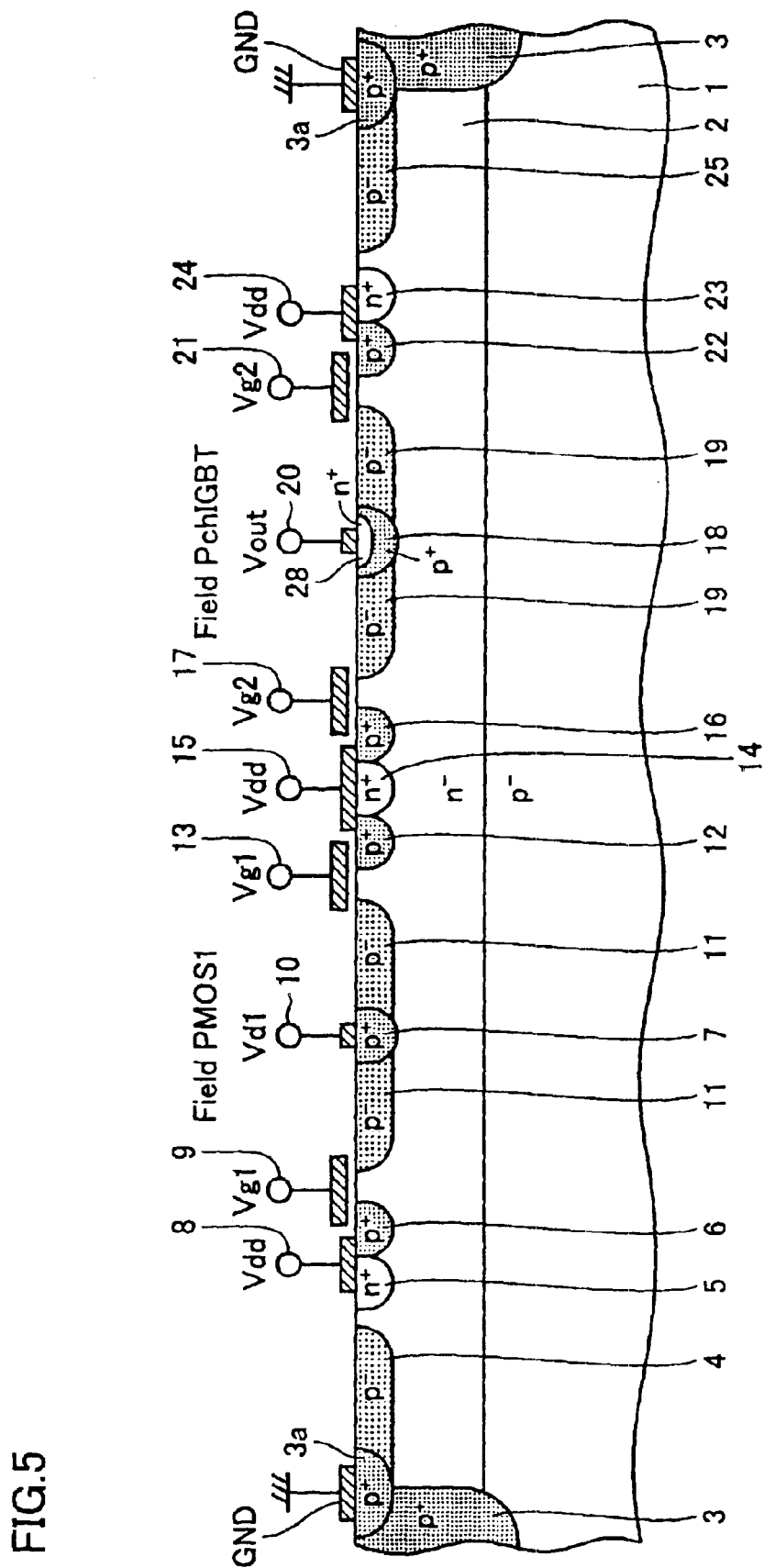
FIG. 5 is a diagram for describing a structure of a semiconductor device according to a second embodiment.
Figure 6:
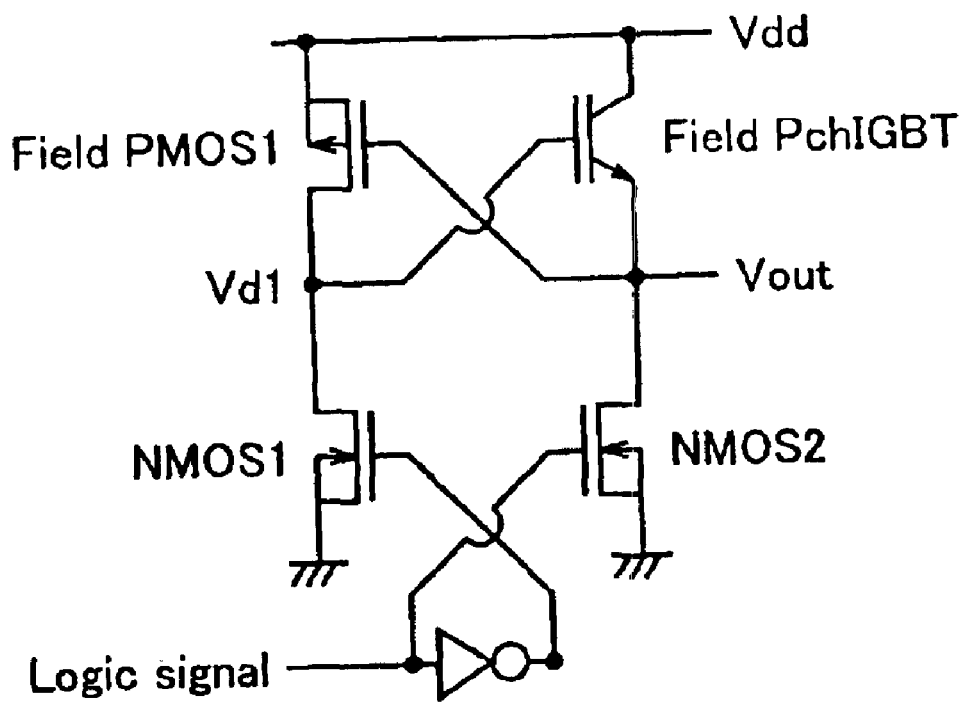
FIG. 6 is a circuit diagram of the semiconductor device according to the second embodiment.

It is noted that FIG. 6 shows a circuit diagram indicating the way of use of the structure of the semiconductor device shown in FIG. 5 in the latch circuit.

Third Embodiment

Next, a structure of a semiconductor device according to the present embodiment will be described with reference to FIG. 7.

The structure of the semiconductor device according to the present embodiment is approximately similar to that of the semiconductor device according to the first embodiment shown in FIG. 1; therefore, only the parts of the structure which is different from those in the semiconductor device according to the first embodiment will be described. The structure of field PMOS 2 in the left side region of the semiconductor device with source electrode $V_{dd}$ 15 as the border is exactly the same as the structure of field PMOS 1 of the first embodiment. The structure of the semiconductor device of the present embodiment differs from the structure of the semiconductor device of the first embodiment in the following manner.

A P⁻-type impurity diffusion region 31 is formed in the vicinity of N⁺-type impurity diffusion region 14. A P⁺-type impurity diffusion region 32 is formed adjacent to P⁻-type impurity diffusion region 31. Further, an N⁺-type impurity diffusion region 33 is formed inside P⁺-type impurity diffusion region 32. A drain electrode $V_{out}$ 38 is connected to both P⁺-type impurity diffusion region 32 and N⁺-type impurity diffusion region 33. Further, a P⁺-type impurity diffusion region 34 is formed at a predetermined distance away from the side of P⁺-type impurity diffusion region 32.

An N⁺-type impurity diffusion region 35 is formed inside P⁺-type impurity diffusion region 34. Further, a gate electrode $V_{g4}$ 39 is provided so as to have a region between P⁺-type impurity diffusion region 32 and P⁺-type impurity diffusion region 34 as a channel region. Further, drain electrode $V_{out}$ 38 is connected to P⁺-type impurity diffusion region 32. Further, a drain electrode $V_{out}$ 40 is connected to P⁺-type impurity diffusion region 34.

Further, a P⁻-type impurity diffusion region 30 is formed adjacent to P⁺-type impurity diffusion region 34. Further, an N⁺-type impurity diffusion region 37 is formed at a predetermined distance away from the side of P⁻-type impurity diffusion region 30. A source electrode $V_{dd}$ 41 is connected to N⁺-type impurity diffusion region 37.

Field PMOS 2 and an NMOS (N Channel Metal Oxide Semiconductor) 4, as high side switches of a latch circuit, also share P⁺-type impurity diffusion region 12 and N⁺-type impurity diffusion region 14, which are connected to source electrode $V_{dd}$ 15, as well as P⁻-type impurity diffusion region 31 in the above described semiconductor device of the present embodiment. Accordingly, the area of the element formation region in a plane parallel to the main surface of semiconductor substrate 1 can be reduced. As a result, the semiconductor device can be miniaturized even by means of the semiconductor device according to the present embodiment.

In addition, the mobility (moving speed) of charge is three times greater in an NMOS in comparison with that in a PMOS. Therefore, the area of an NMOS in the direction parallel to the main surface of semiconductor substrate 1 can be reduced in comparison with a PMOS.

Figure 7:
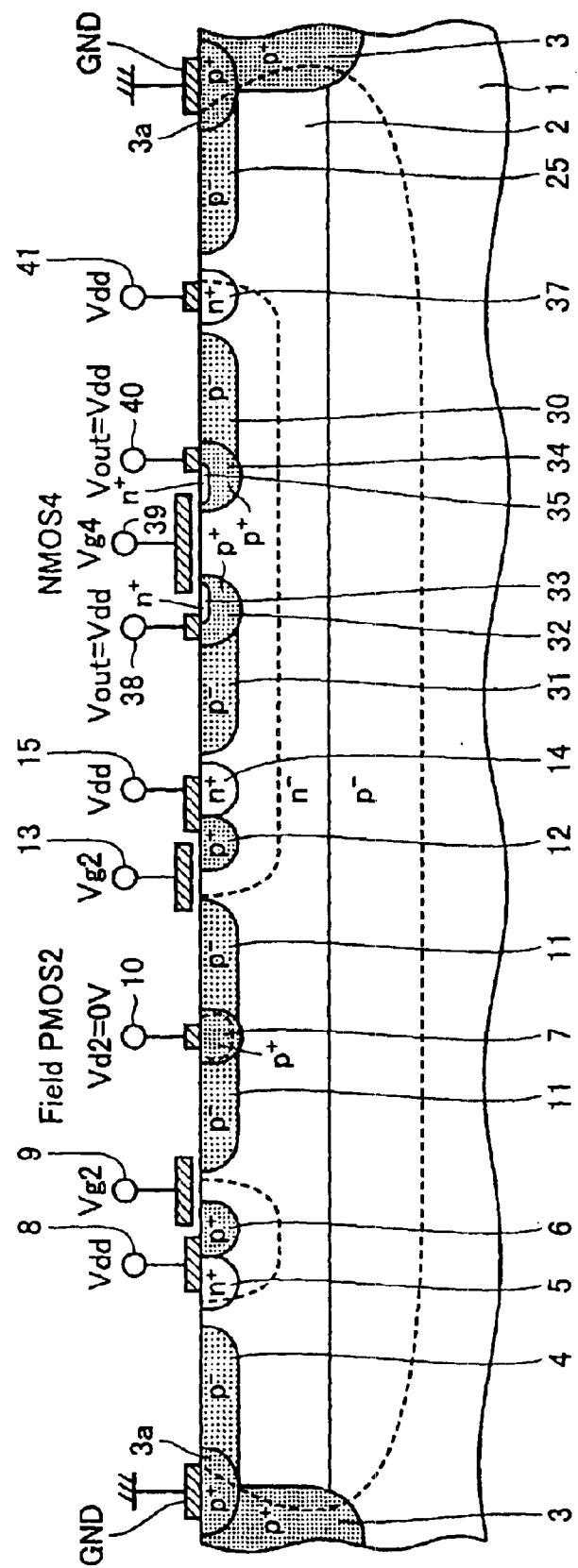
FIG. 7 is a diagram for describing a depletion layer formed when a semiconductor device according to a third embodiment operates.

Further, the dotted line in FIG. 7 shows a depletion layer formed in the case where a voltage equal to or less than threshold voltage is applied to gate electrode $V_{g2}$ 9, 13 so that the voltage of drain electrode $V_{d2}$ 10 becomes 0 and, also, a voltage equal to or more than threshold voltage is applied to gate electrode $V_{g4}$ 39 so that the voltage of drain electrode $V_{out}$ 38, 40 becomes $V_{dd}$.

Figure 8:
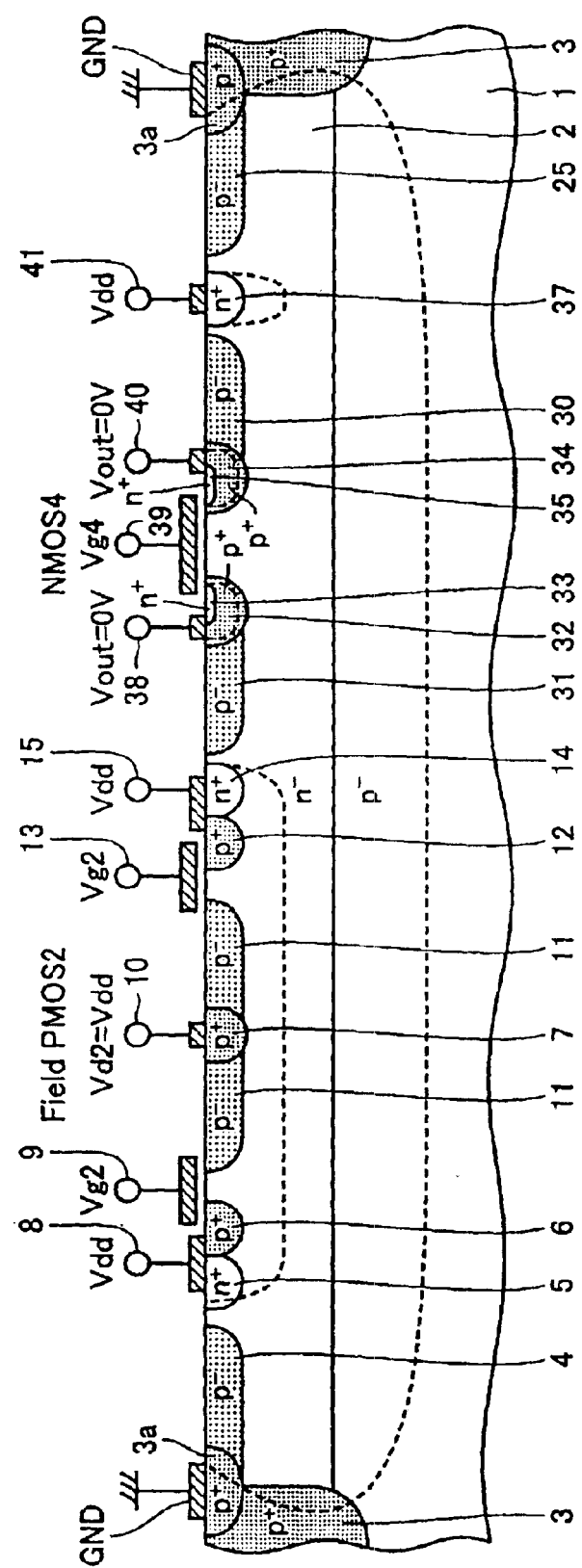
FIG. 8 is a diagram for describing a depletion layer formed when the semiconductor device according to the third embodiment operates.

In addition, FIG. 8 shows the structure of the same semiconductor device shown in FIG. 7. The dotted line in FIG. 8 shows a depletion layer formed in the case where a voltage equal to or more than threshold voltage is applied to gate electrode $V_{g2}$ 9, 13 so that the voltage of drain electrode $V_{d2}$ 10 becomes $V_{dd}$ and, also, a voltage equal to or less than the threshold voltage is applied to gate electrode $V_{g4}$ 39 so that the voltage of drain electrode $V_{out}$ becomes 0.

Figure 9:
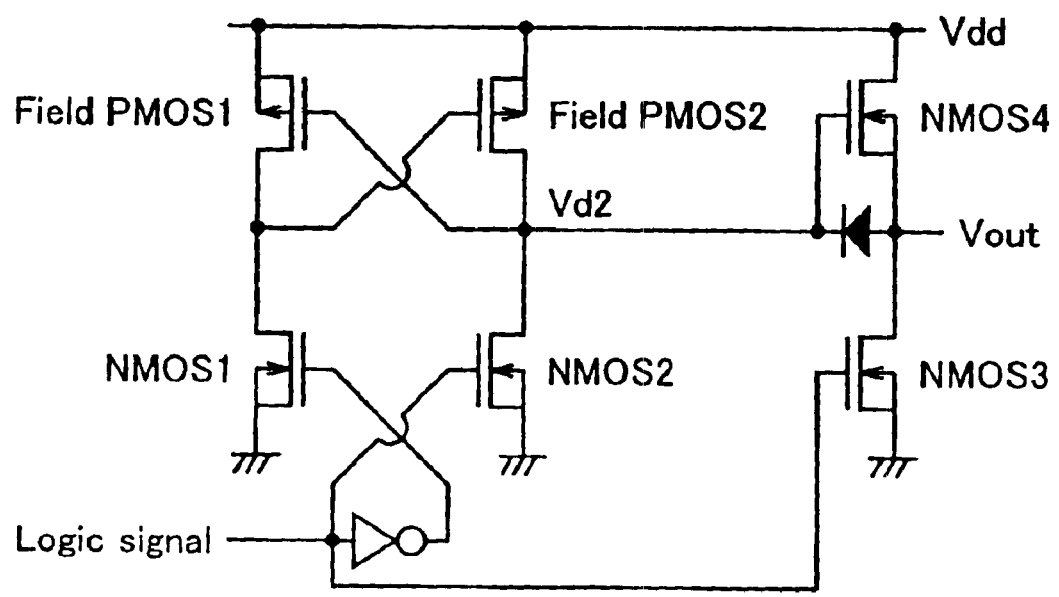
FIG. 9 is a circuit diagram of the semiconductor device according to the third embodiment.

It is noted that FIG. 9 shows a circuit diagram indicating the way of use of the semiconductor device shown in FIGS. 7 and 8 in a circuit (latch circuit). This latch circuit differs from that of the circuit diagram of the semiconductor device according to the first or second embodiment in that a Zener diode is provided to protect gate electrode $V_{g4}$ 39 of NMOS 4.

Further, although field PMOS 2 is not shown in FIGS. 7 and 8, field PMOS 2, field PMOS 1 and NMOS 4 may share P⁺-type impurity diffusion region 12 and N⁺-type impurity diffusion region 14, which are connected to source electrode $V_{dd}$ 15, as well as P⁺-type impurity diffusion region 31.

Fourth Embodiment

Figure 10:
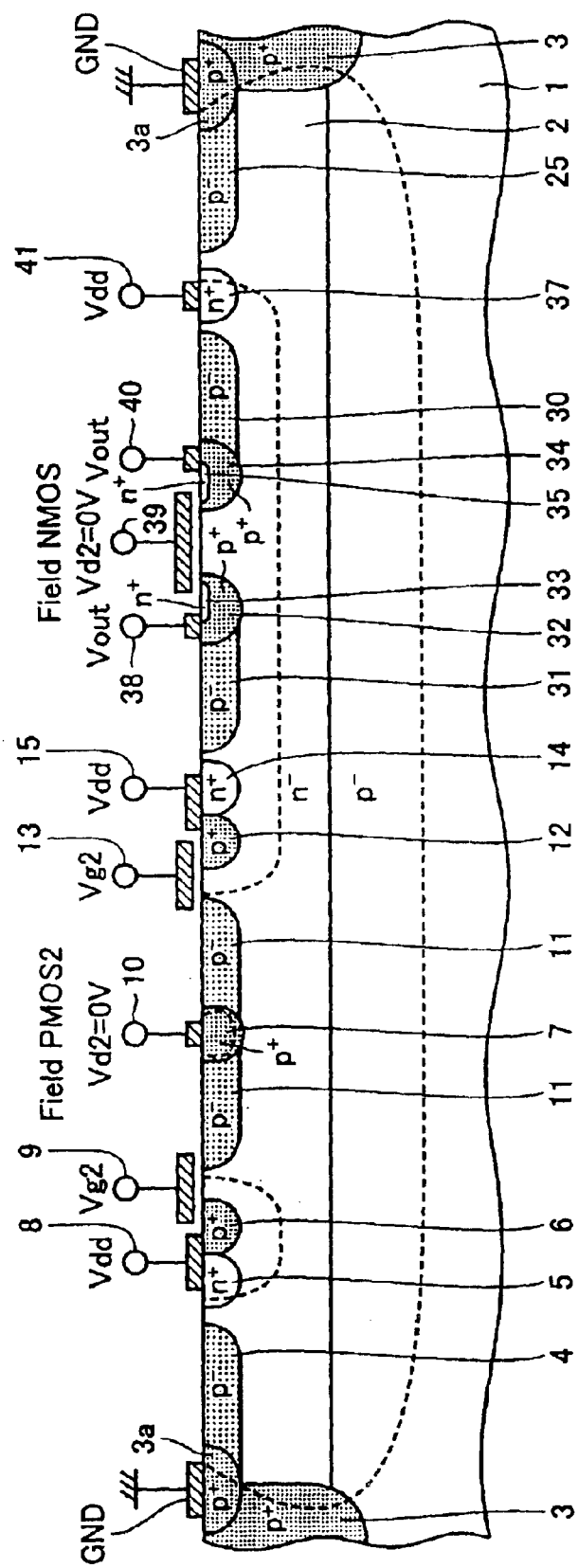
FIGS. 10 and 11 are diagrams for describing a structure of a semiconductor device according to a fourth embodiment.

Next, a semiconductor device according to a fourth embodiment will be described with reference to FIGS. 10 to 12. The structure of the semiconductor device according to the fourth embodiment differs from that of the semiconductor device according to the third embodiment shown in FIGS. 7 and 8 only in that NMOS 4 is a field NMOS. A voltage of 0 is applied to a gate electrode $V_{d2}$ 39 of this field NMOS. Further, a voltage of 0 is also applied to drain electrode $V_{d2}$ 10 of field PMOS 2. The broken line in FIG. 10 shows a depletion layer formed at this time.

Figure 11:
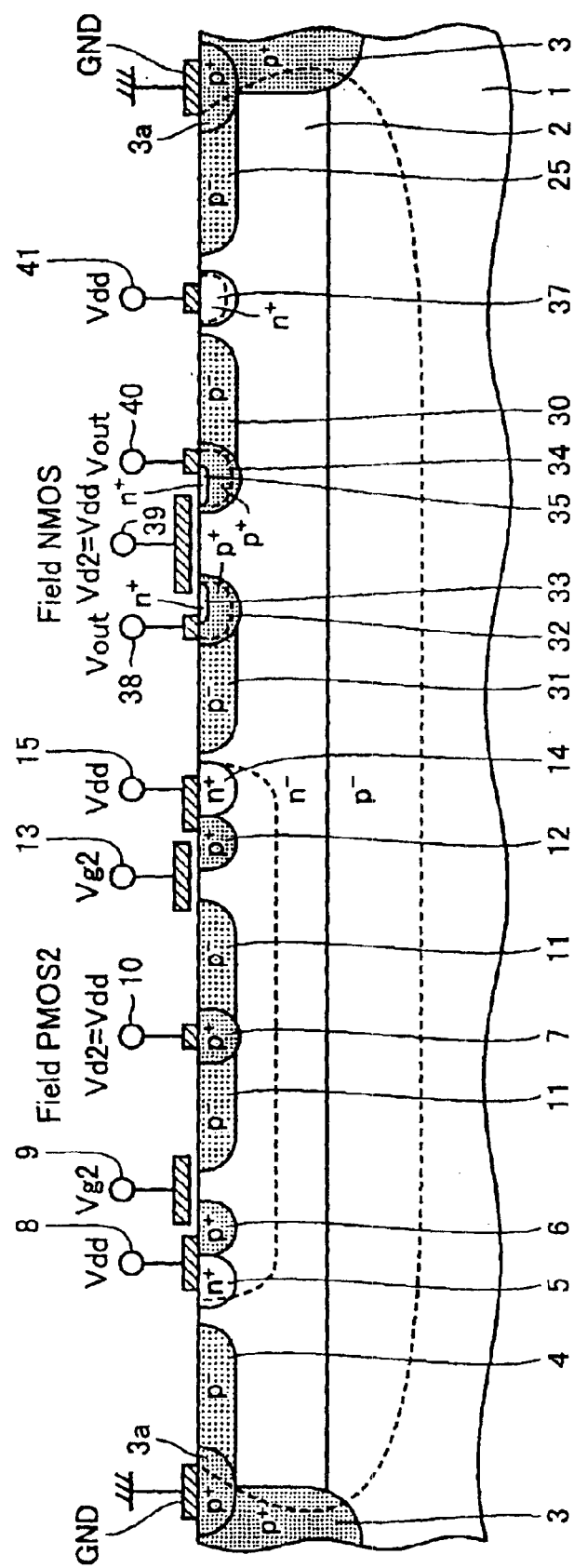

Further, voltage $V_{dd}$ is applied to drain electrode $V_{d2}$ 10 of field PMOS 2 and voltage $V_{dd}$ is applied to gate electrode $V_{d2}$ 39 of the field NMOS in FIG. 11. The dotted line in FIG. 11 shows a depletion layer formed at this time. In addition, FIG. 12 shows a circuit diagram indicating the way of use of the semiconductor device shown in FIGS. 10 and 11 in a circuit.

Field PMOS 2 and the field NMOS, as high side switches of a latch circuit, also share P⁺-type impurity diffusion region 12 and N⁺-type impurity diffusion region 14, which are connected to source electrode $V_{dd}$ 15, in the above described semiconductor device of the present embodiment. Further, N⁺-type impurity diffusion region 14 connected to source electrode $V_{dd}$ 15 and P⁻-type impurity diffusion region 31 connected to drain electrode $V_{out}$ 38 are provided adjacent to each other in the semiconductor device of the present embodiment. Accordingly, the area of the semiconductor device in the direction parallel to the main surface of semiconductor substrate 1 can be reduced. As a result, the structure of the semiconductor device of the present embodiment also allows miniaturization of the element formation region.

Figure 12:
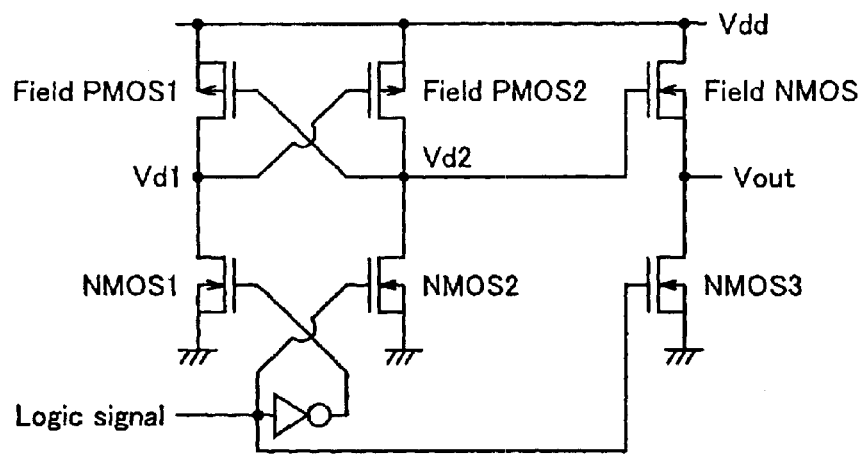
FIG. 12 is a circuit diagram of the semiconductor device according to the fourth embodiment.

It is noted that, as shown in FIG. 12, the latch circuit of the present embodiment has a field NMOS in place of the NMOS of the latch circuit, shown in FIG. 9, of the third embodiment. A field NMOS has a withstand voltage higher than that of an NMOS. Accordingly, a Zener diode as used in the latch circuit so as to protect the NMOS, as shown in FIG. 9, is not used herein.

Fifth Embodiment

Figure 13:
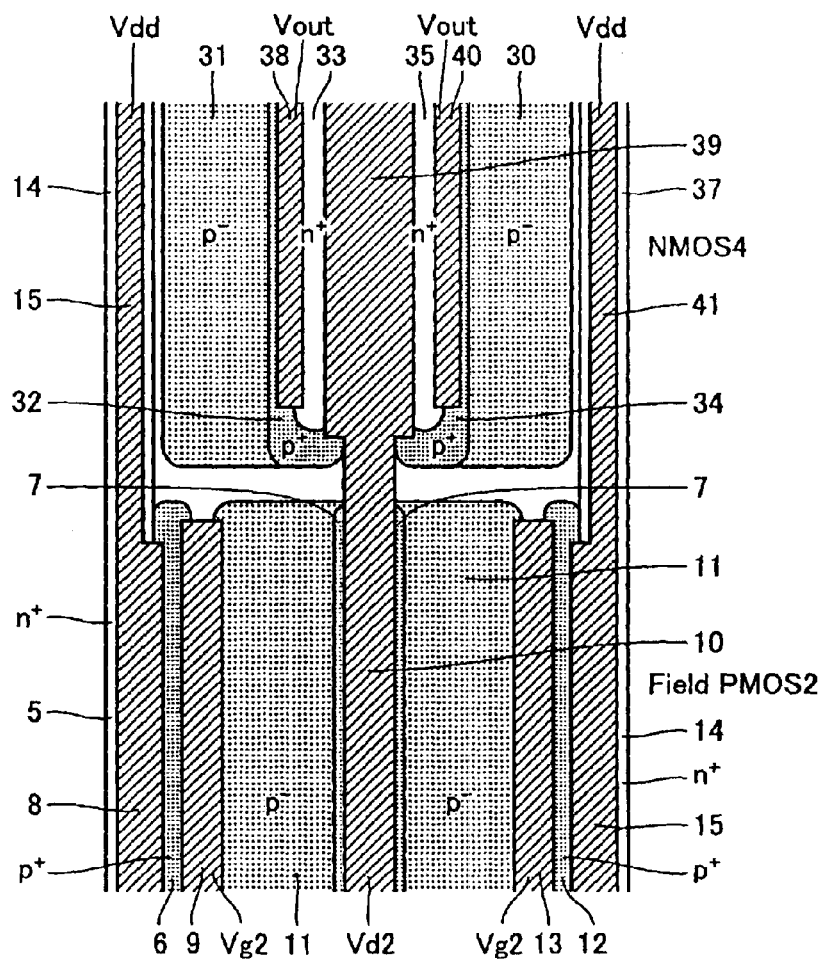
FIGS. 13 to 16 are diagrams for describing structures of semiconductor devices according to fifth to eighth embodiments, respectively.

A semiconductor device according to a fifth embodiment will be described with reference to FIG. 13. FIG. 13 is a diagram showing a structure that the planar positions of field PMOS 2 and NMOS 4 of the semiconductor device according to the third embodiment shown in FIGS. 7 to 9 are changed. It is noted that FIG. 13 is a diagram schematically showing the vicinity of the main surface of the semiconductor substrate when viewed in the direction perpendicular to the main surface of semiconductor substrate 1.

The respective parts in the structure shown in FIG. 13 to which reference symbols are attached have the same functions as the respective parts in the structure shown in FIGS. 7 the 9 to which the same reference symbols are attached. In other words, the semiconductor device shown in FIG. 13 and the semiconductor device shown in FIGS. 7 to 9 have the same functions and differ from each other only in the arrangement of the respective parts.

As shown in FIG. 13, gate electrode 39 of NMOS 4 and drain electrode 10 of field PMOS 2 are integrally formed of the same conductive layer and sequentially extend in a predetermined direction in a linear manner. Further, source electrodes 15, 41 of NMOS 4 and source electrode 8, 15 of field PMOS 2 are integrally formed of the same conductive layer and sequentially extend in a predetermined direction in a linear manner.

The difference in potential between source electrodes 15, 41 of NMOS 4 and drain electrode 10 of field PMOS 2 is approximately the same as the difference in potential between gate electrode 39 and source electrodes 15, 41 of NMOS 4.

Therefore, the semiconductor device of the present embodiment is formed so that the punch through voltage between P⁺-type impurity diffusion region 7 beneath drain electrode 10 of field PMOS 2 and P⁺-type impurity diffusion regions 32, 34 beneath gate electrode 39 of NMOS 4 becomes greater than the difference in potential between source electrodes 15, 41 of NMOS 4 and drain electrode 10 of field PMOS 2 in the case where NMOS 4 and field PMOS 2 are formed in the arrangement shown in FIG. 13.

With this arrangement, the generation of punch through between P⁺-type impurity diffusion region 7 beneath drain electrode 10 of field PMOS 2 and P⁺-type impurity diffusion regions 32, 34 beneath gate electrode 39 of NMOS 4 can be suppressed even in the case where NMOS 4 and field PMOS 2 are provided in close proximity to each other.

Sixth Embodiment

Figure 14:
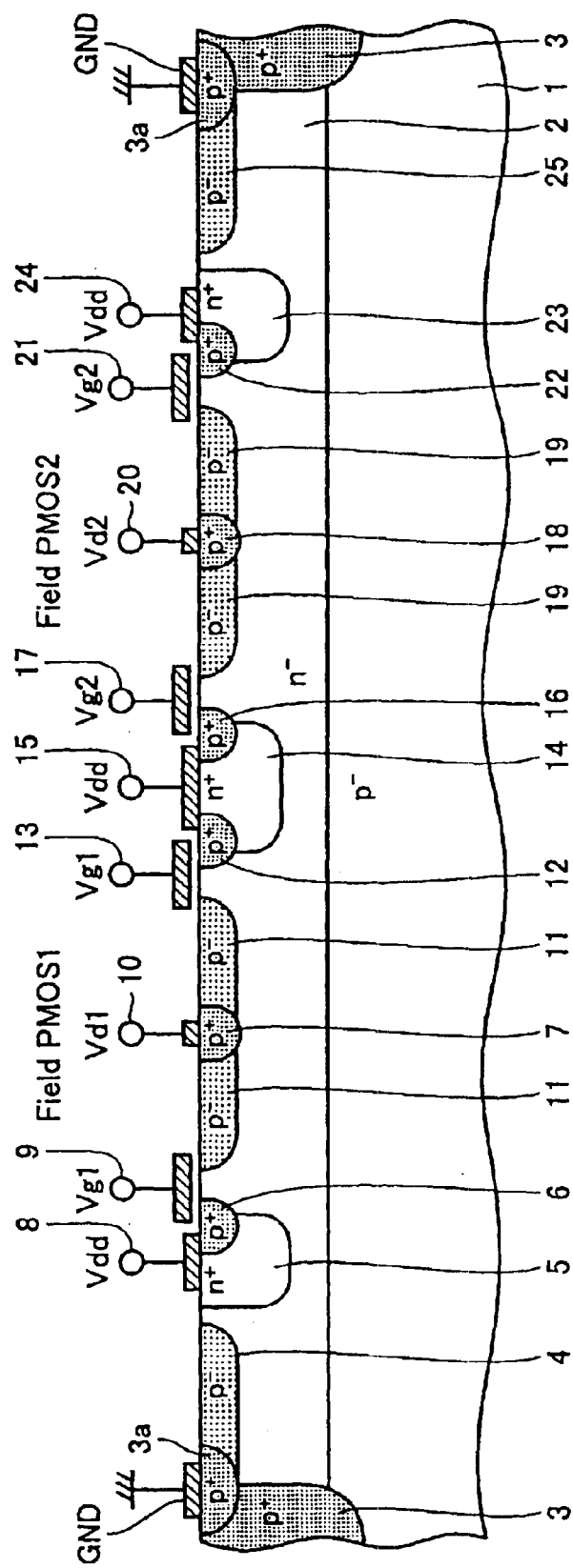

Next, a structure of a semiconductor device according to the present embodiment will be described with reference to FIG. 14.

The structure of the semiconductor device of the present embodiment is approximately similar to that of the semiconductor device, shown in FIG. 1, in the first embodiment. However, the structure of the semiconductor device of the present embodiment differs from that of the semiconductor device shown in FIG. 1 in that N⁺-type impurity diffusion regions 5, 14 and 23 are provided so as to reach very deep positions and so as to spread over a very wide region in comparison with N⁺-type impurity diffusion regions 5, 14 and 23 of the semiconductor device according to the first embodiment.

Thus, N⁺-type impurity diffusion regions 5, 14 and 23 are formed deeply and widely; thereby, N⁺-type impurity diffusion regions 5, 14 and 23 are located between P⁺-type semiconductor substrate 1 and P⁺-type impurity diffusion regions 6, 12, 16 and 22. Thereby, an effect can be obtained in that the operation of a parasitic V-PNP Tr formed of P⁺-type semiconductor substrate 1, N⁻-type impurity diffusion region 2 and P⁺-type impurity diffusion regions 6, 12, 16 and 22 can be suppressed.

Seventh Embodiment

Figure 15:
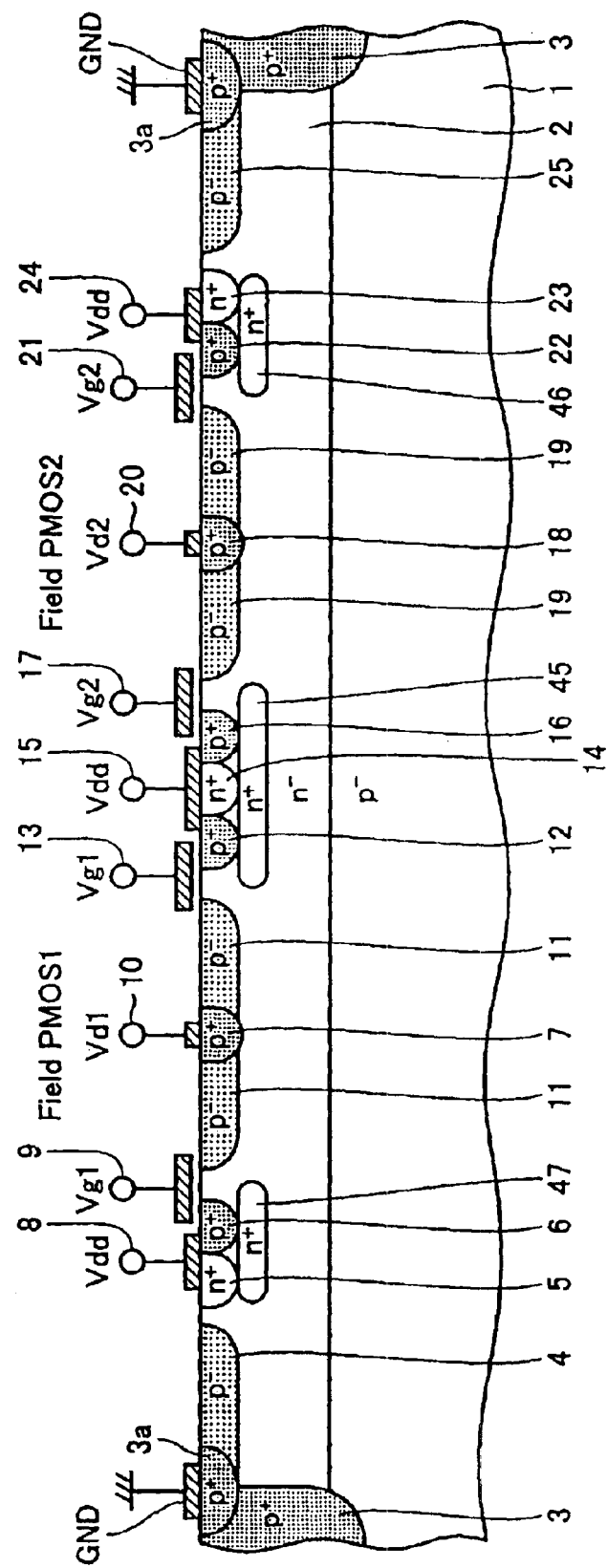

Next, a structure of a semiconductor device according to the present embodiment will be described with reference to FIG. 15.

The structure of the semiconductor device according to the present embodiment is approximately similar to that of the semiconductor device, shown in FIG. 1, of the first embodiment. However, the structure of the semiconductor device according to the present embodiment shown in FIG. 15 differs from that of the semiconductor device shown in FIG. 1 in regard to the following points.

An N⁺-type impurity diffusion region 45 is formed so as to bring into contact with the lower surfaces of N⁺-type impurity diffusion region 14, P⁺-type impurity diffusion region 12 and P⁺-type impurity diffusion region 16. Further, N⁺-type impurity diffusion region 46 is formed so as to bring into contact with the lower surfaces of N⁺-type impurity diffusion region 22 and N⁺-type impurity diffusion region 23. In addition, an N⁺-type impurity diffusion region 47 is formed so as to bring into contact with the lower surfaces of N⁺-type impurity diffusion region 5 and P⁺-type impurity diffusion region 6.

$N^+$-type impurity diffusion regions 47, 45 and 46 are located between $P^+$-type semiconductor substrate 1 and $P^+$-type impurity diffusion regions 6, 12, 16 and 22 in the semiconductor device of the above described structure. With this structure, an effect can be obtained in that the operation of a parasitic V-PNP Tr formed of $P^+$-type semiconductor substrate 1, $N^-$-type impurity diffusion region 2 and $P^+$-type impurity diffusion regions 6, 12, 16 and 22 can be suppressed.

Eighth Embodiment

Figure 16:
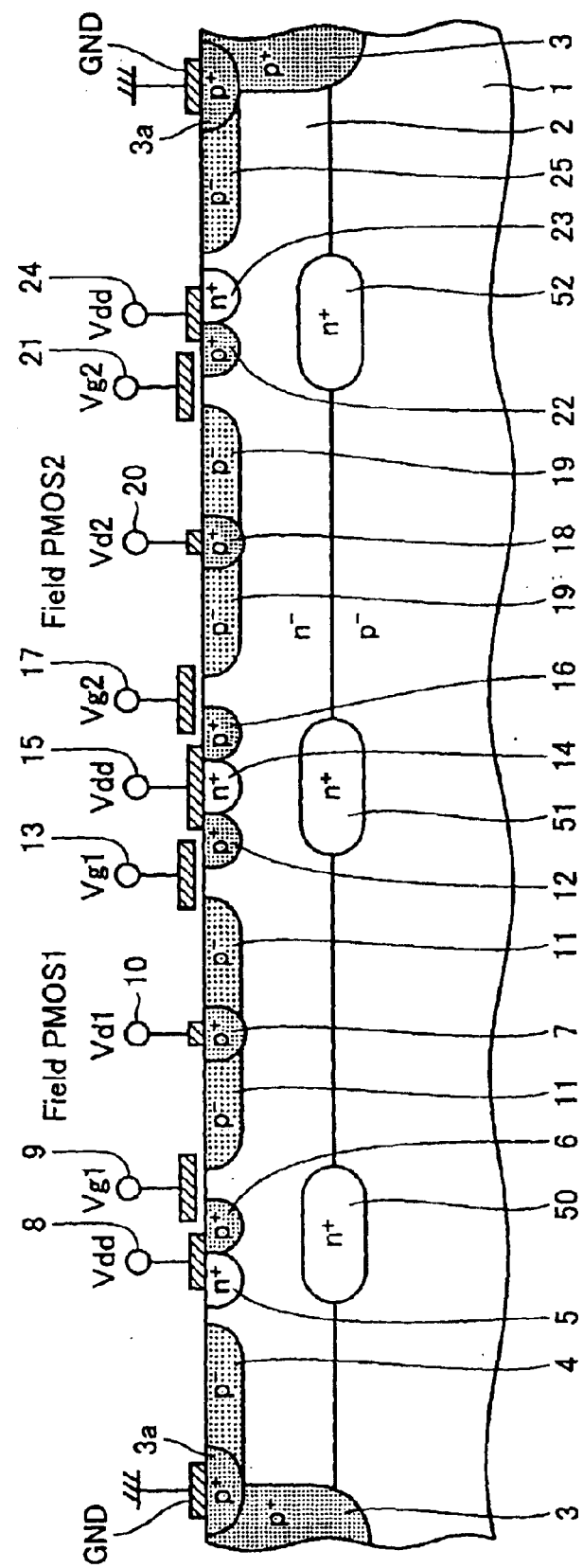

Next, a structure of a semiconductor device according to the present embodiment will be described with reference to FIG. 16.

The structure of the semiconductor device according to the present invention is approximately similar to that of the semiconductor device according to the first embodiment shown in FIG. 1. However, the semiconductor device according to the present embodiment differs from the semiconductor device shown in FIG. 1 in the following point.

An $N^+$-type impurity diffusion region 51 is formed beneath $P^+$-type impurity diffusion region 12, $N^+$-type impurity diffusion region 14 and $P^+$-type impurity diffusion region 16 so as to straddle the borderline between $N^-$-type epitaxial layer 2 and semiconductor substrate 1 having a $P^-$-type impurity diffusion region. Further, an $N^+$-type impurity diffusion region 50 is formed beneath $N^+$-type impurity diffusion region 5 and $P^+$-type impurity diffusion region 6. Further, an $N^+$-type impurity diffusion region 52 is formed beneath $N^+$-type impurity diffusion region 23 and $P^+$-type impurity diffusion region 22.

$N^+$-type impurity diffusion regions 50, 51 and 52 are located between $P^+$-type semiconductor substrate 1 and $P^+$-type impurity diffusion regions 6, 12, 16 and 22 in the above described semiconductor device. Thereby, an effect can be obtained in that the operation of a parasitic V-PNP Tr formed of $P^+$-type semiconductor substrate 1, $N^-$-type impurity diffusion region 2 and $P^+$-type impurity diffusion regions 6, 12, 16 and 22 can be suppressed.

It is noted that two elements are formed inside the element isolation part in the semiconductor device of each of the above described embodiments and a structure is shown wherein the two elements share a source region. However, the semiconductor device of the present invention may be a semiconductor device having a structure that a plurality, three, or more, of elements, wherein there is no limitation to two elements, shares a source region.

In addition, a structure that the impurity diffusion region shared by two elements is a source region is shown in the semiconductor device of each of the embodiments. However, an effect can be obtained in that the area of the elements in the direction parallel to the main surface of the semiconductor substrate can be reduced even in the case where the semiconductor device of the present invention has a structure that the impurity diffusion region shared by the two elements is a drain region.

It is noted that reference symbols are attached in the drawings of each of the above described embodiments. Although the parts indicated by the same reference symbols have the same functions in each of the drawings, descriptions of the functions of corresponding parts are not repeated in the embodiments.

In addition, although the following repeats the descriptions found in each of the embodiments, one of the features of the semiconductor device according to each of the first to eighth embodiments is that the semiconductor device is utilized in the state where an area beneath one of the two high side switches of the latch circuit is completely depleted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an element isolation part surrounding one element formation region when viewed in the direction perpendicular to a main surface of a semiconductor substrate, 1 and electrically isolating the one element formation region from another element formation regions; and
   a plurality of elements provided in said element formation region, wherein
   said plurality of elements includes a first field-effect transistor and a second field-effect transistor functioning as high side switches of a latch circuit,
   said semiconductor device is utilized in the state where a lower side of one of said first field-effect transistor and said second field-effect transistor is completely depleted, and
   said first field-effect transistor and said second field-effect transistor share a source region.

2. The semiconductor device according to claim 1, wherein said first field-effect transistor and said second field-effect transistor are P-channel field-effect transistors, respectively.

3. A semiconductor device comprising:
   an element isolation part surrounding one element formation region when viewed in the direction perpendicular to a main surface of a semiconductor substrate, and electrically isolating the one element formation region from another element formation regions; and
   a plurality of elements provided in said element formation region, wherein
   said plurality of elements includes a first field-effect transistor and a second field-effect transistor functioning as highside switches of a latch circuit
   said semiconductor device is utilized in the state where a lower side of one of said first field-effect transistor and said second field-effect transistor is completely depleted,
   said first field-effect transistor and said second field-effect transistor share a source region or a drain region,
   said first field-effect transistor is a P-channel field-effect transistor, and
   said second field-effect transistor is a P-channel insulated gate bipolar transistor.

4. The semiconductor device according to claim 1, wherein
   said first field-effect transistor is a P-channel field-effect transistor, and
   said second field-effect transistor is an N-channel field-effect transistor.

5. A semiconductor device comprising:
   an element isolation part surrounding one element formation region when viewed in the direction perpendicular to a main surface of a semiconductor substrate, of a first conductivity type and electrically isolating the one element formation region from another element formation regions; and
   a plurality of elements provided in said element formation region, wherein:

said plurality of elements includes a first field-effect transistor and a second field-effect transistor functioning as high side switches of a latch circuit;

said semiconductor device is utilized in the state where a lower side of one of said first field-effect transistor and said second field-effect transistor is completely depleted;

said first field-effect transistor and said second field-effect transistor share a source region or a drain region; wherein an impurity diffusion layer of a second conductive type, formed on the semiconductor substrate of the first conductive type so as to cover the semiconductor substrate of the first conductive type, on which said first field-effect transistor and said second field-effect transistor are provided;

an impurity diffusion region of the first conductive type formed inside the impurity diffusion layer of the second conductive type and connected to a source electrode or a drain electrode of one of said first field effect transistor and said second field-effect transistor; and an impurity diffusion region of the second conductive type, having an impurity concentration higher than that of said impurity diffusion layer of the second conductive type, located between the impurity diffusion region of the first conductive type and said semiconductor substrate of the first conductive type.

6. A semiconductor device comprising: a first field-effect transistor having a channel region of a first conductive type and a gate electrode; and a second field-effect transistor having a channel region of a second conductive type which is a conductive type opposite to said first conductive type and a drain electrode, the gate electrode of said first field-effect transistor and the drain electrode of said second field-effect transistor being integrally formed of the same conductive layer and extending in sequence in a predetermined direction in a linear manner, and the source electrode of said first field-effect transistor and the source electrode of said second field-effect transistor being integrally formed of the same conductive layer and extending in sequence in a predetermined direction in a linear manner, wherein the difference in potential between the source electrode of said first field-effect transistor and the drain electrode of said second field-effect transistor is approximately the same as the difference in potential between the gate electrode and the source electrode of said first field-effect transistor, and the punch through voltage between an impurity diffusion region of the second conductive type beneath the drain electrode of said second field effect transistor and the impurity diffusion region of the second conductive type beneath the gate electrode of said first field-effect transistor is greater than the difference in potential between the source electrode of said first field-effect transistor and the drain electrode of said second field-effect transistor.

* * * * *